(12) United States Patent
Kim et al.

(10) Patent No.: US 6,653,724 B1
(45) Date of Patent: Nov. 25, 2003

(54) CHIP ON BOARD PACKAGE FOR OPTICAL MICE AND LENS COVER FOR THE SAME

(75) Inventors: Tae Jun Kim, Suwon (KR); Yoo Sun Song, Seoul (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/198,982

(22) Filed: Jul. 22, 2002

(30) Foreign Application Priority Data

May 6, 2002 (KR) ........................................ 2002-24663

(51) Int. Cl.⁷ ........................ H01L 23/06; H01L 23/495
(52) U.S. Cl. ........................ 257/684; 257/680; 257/697; 257/584; 257/666
(58) Field of Search ................................ 257/684, 680, 257/697, 584, 731, 666, 434–436

(56) References Cited

U.S. PATENT DOCUMENTS

| | | | |
|---|---|---|---|
| 4,650,285 A | * | 3/1987 | Stevenson .................... 350/320 |
| 4,797,544 A | * | 1/1989 | Montgomery et al. ....... 250/221 |
| 4,868,638 A | | 9/1989 | Hirata et al. |
| 4,920,260 A | * | 4/1990 | Victor et al. ................. 250/221 |
| 5,006,922 A | | 4/1991 | McShane et al. |
| 5,102,829 A | | 4/1992 | Cohn |
| 5,103,292 A | | 4/1992 | Mahulikar |
| 5,233,225 A | | 8/1993 | Ishida et al. |
| 5,296,724 A | * | 3/1994 | Ogata et al. .................. 257/98 |
| 5,686,758 A | | 11/1997 | Arai et al. |
| 5,715,595 A | | 2/1998 | Kman et al. |
| 5,734,555 A | | 3/1998 | McMahon |
| 5,789,810 A | | 8/1998 | Gross et al. |
| 5,952,716 A | | 9/1999 | Dibble et al. |
| 6,097,086 A | | 8/2000 | Crane, Jr. et al. |
| 6,100,585 A | | 8/2000 | Chiba |
| 6,271,480 B1 | | 8/2001 | Yamaguti et al. |

FOREIGN PATENT DOCUMENTS

JP      63-204669      *  3/1982  ................ 257/434

* cited by examiner

*Primary Examiner*—Jasmine Clark
(74) *Attorney, Agent, or Firm*—Lowe Hauptman Gilman & Berner LLP

(57) ABSTRACT

Disclosed herein is a chip on board lead package for optical mice and lens cover for the same. A semiconductor chip on board package for optical mice has a board, a semiconductor chip, at least one circuit pattern, at least one bonding wire, and a lens cover. The board has top and bottom surfaces, and a pair of via holes. The semiconductor chip is attached to a center portion on the top surface of the board and provided with a plurality of electrode terminals. The circuit pattern is formed on the top surface of the board. The bonding wire electrically connects the electrode terminals of the semiconductor chip with the circuit pattern. The lens cover encloses the top surface of the board and has a lens disposed on the same axis as that of the semiconductor chip, a plurality of electrode pins formed at positions of the lens cover corresponding to the positions of the via holes in the board to be integrated with the lens cover, and an opening formed in a center portion within the lens cover.

16 Claims, 5 Drawing Sheets

CHIP ON BOARD PACKAGE FOR OPTICAL MICE AND LENS COVER FOR THE SAME

BACKGROUND OF THE INVENTION

1. Field of the Invention

The present invention relates generally to a chip on board package for optical mice and lens cover for the same, and more particularly to a chip on board package for optical mice and lens cover for the same, in which a semiconductor chip of a package for optical mice is connected to circuit patterns on a board, and the circuit patterns are connected to a plurality of pins functioning as lead frames.

2. Description of the Prior Art

Generally, in semiconductor packages used for optical mice, a construction using lead frames is popularly used, which is depicted in FIG. 1. Referring to FIG. 1, a semiconductor chip 102 is attached to a die paddle 101. The die paddle 101 is electrically connected to lead frames 105 using fine gold, wires 103. In this case, the fine gold wires 103 are bonding wires. The die paddle 101 and some portion of each lead frame 105 are molded by epoxy molding compound 106, thus allowing their positions to be fixed. Then, a cavity 108 in which both the semiconductor chip 102 and the fine gold wires 103 are accommodated is enclosed with a cover 107. As described above, after the cavity 108 is enclosed, the lead frames 105 are adjusted to be mounted to a set (not shown) so as to form external terminals. In order to mount such a semiconductor package using lead frames to the set, via holes are formed in the set, and then leads are inserted into the via holes and soldered.

However, the package using lead frames is problematic in that it requires high initial investment cost so as to develop and produce lead frames, and molds must be managed continuously. Further, if lead frames in use must be changed, the same investment cost as that for previously used lead frames is inevitably required, thus preventing new products from being developed.

In order to overcome such problems, there is proposed a chip on board (COB) package not using lead frames as a typical semiconductor chip package. Such a COB semiconductor chip package is popularly used for supplementing disadvantages of the semiconductor chip package using lead frames. FIG. 2 shows a conventional COB package. Referring to FIG. 2, a semiconductor chip 202 is mounted on a board 201, and circuit patterns 204 are formed around the semiconductor chip 202 on the board 201. The circuit patterns 204 are extended to the bottom of the board 201 via the side surfaces of the board 201, thus enabling terminals 205 to be formed. Circuit patterns 204 are electrically connected to terminals of the semiconductor chip 202 by fine gold wires 203. In order to protect the semiconductor chip 202 and the fine gold wires 203, they are molded using epoxy resin. When the COB package is mounted on a set, the terminals 205 formed beneath the board 201 are directly-attached to the set through a soldering process, etc. Since the COB package does not use lead frames, it does not require high initial investment cost, it can cope with variations in products, and can decrease development time of new products.

However, there is difficulty in using the COB package as a semiconductor chip package for optical mice. That is, in order to allow light recognized by an optical mouse to reach a semiconductor chip through a lens, focus must be controlled by adjusting the height of the lens when the semiconductor chip is mounted on a set. However, if the conventional COB package is used, a board is directly mounted on the set, so the height of the package cannot be adjusted.

Further, as a mouse is used for various purposes, there are required mouse devices having various and complicated functions, compared with a conventional mouse. For this reason, the number of terminals of a semiconductor chip package is increasing compared with a conventional semiconductor chip package. Therefore, there is needed a new package product in which more terminals than those of a conventional package product can be formed.

Consequently, there is required a package for optical mice, which can be used as a lead frame package if necessary, having not only advantages of the COB package that initial investment cost is low, a development time of a product is short and application to development of various products is possible, but also advantages of the lead frame package that the focus of light can be controlled through a lens if the lead frame package is used for optical mice and additional terminals can be easily formed.

SUMMARY OF THE INVENTION

Accordingly, the present invention has been made keeping in mind the above problems occurring in the prior art, and an object of the present invention is to provide a semiconductor chip on board package for optical mice and lens cover for the same, which can simplify and facilitate a manufacturing process of a chip on board package, reduce initial investment cost thereof, reduce a development time thereof, and can easily cope with variations in products, by using a lens cover integrated with electrode pins.

Another object of the present invention is to provide a semiconductor chip on board package for optical mice and lens cover for the same, which can be used as a lead frame package when a semiconductor package is mounted on a set, and can have more terminals than those of a conventional chip on board package.

A further object of the present invention is to provide a semiconductor chip on board package for optical mice and lens cover for the same, in which central axes of both a lens and a semiconductor chip can easily correspond to each other when a board and a lens cover are assembled, and the lens cover has opened sides so as to combine several not-cut boards with lens covers, thus improving productivity of a semiconductor chip on board package.

In order to accomplish the above object, the present invention provides a semiconductor chip on board package for optical mice, comprising a board having top and bottom surfaces, and a pair of via holes formed along opposite side surfaces of the board to pass through the top and bottom surfaces; a semiconductor chip attached to a center portion on the top surface of the board and provided with a plurality of electrode terminals formed therein; at least one circuit pattern formed on the top surface of the board to be extended from the position to which the semiconductor chip of the board is attached, to positions in which the via holes are formed; at least one bonding wire for electrically connecting the electrode terminals of the semiconductor chip with the circuit pattern; and a lens cover for enclosing the top surface of the board, the lens cover having a lens disposed on the same axis as that of the semiconductor chip, a pair of electrode pins formed at positions of the lens cover corresponding to the positions of the pair of via holes in the board to be integrated with the lens cover, and an opening formed in a center portion within the lens cover for accommodating the semiconductor chip therein, wherein one end of each of the electrode pins of the lens cover is protruded downwardly from the bottom surface of the board through each via hole when the lens cover is combined with the board, and the electrode pins are bonded to the via holes of the board with solder, thus enabling the electrode pins to be electrically connected to the circuit pattern of the board.

Further, the present invention provides a semiconductor chip on board package for optical mice, comprising a board having top and bottom surfaces, and a plurality of via holes formed along opposite longer side surfaces of the board to pass through the top and bottom surfaces; a semiconductor chip arranged between the opposite via holes on the top surface of the board and provided with a plurality of electrode terminals formed therein; at least one circuit pattern formed on the top surface of the board to be extended from the position to which the semiconductor chip of the board is attached, to positions in which the via holes are formed; at least one bonding wire for electrically connecting the electrode terminals of the semiconductor chip with the circuit pattern; and a lens cover for enclosing the top surface of the board, the lens cover having a lens disposed on the same axis as that of the semiconductor chip, a plurality of electrode pins formed at positions of the lens cover corresponding to the positions of the via holes in the board to be integrated with the lens cover, and an opening formed in a center portion within the lens cover so as to prevent interference with the semiconductor chip, wherein one end of each of the electrode pins of the lens cover is protruded downwardly from the bottom surface of the board through each via hole when the lens cover is combined with the board, and the electrode pins are bonded to the via holes of the board with solder, thus enabling the electrode pins to be electrically connected to the circuit pattern of the board.

Further, the present invention provides a lens cover used for a chip on board package for optical mice, the lens cover enclosing a board, in which a semiconductor chip having a plurality of electrode terminals formed therein is attached to a top surface of the board, a plurality of via holes are formed along opposite longer side surfaces of the board to pass through the top and bottom surfaces, at least one circuit pattern is formed on the top surface of the board to be extended from the position to which the semiconductor chip is attached, to positions in which the via holes are formed, and the electrode terminals of the semiconductor chip are electrically connected to the circuit pattern by wire bonding wherein the lens cover encloses the top surface of the board and has a lens disposed on the same axis as that of the semiconductor chip, a plurality of electrode pins formed at positions of the lens cover corresponding to the positions of the via holes in the board to be integrated with the lens cover, and an opening formed in a center portion within the lens cover so as to prevent interference with the semiconductor chip, and one end of each of the electrode pins of the lens cover is protruded downwardly from the bottom surface of the board through each via hole when the lens cover is combined with the board, and the electrode pins are bonded to the via holes of the board with solder, thus enabling the electrode pins to be electrically connected to the circuit pattern of the board.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, embodiments of the present invention will be described in detail with reference to the attached drawings.

Figure 1:
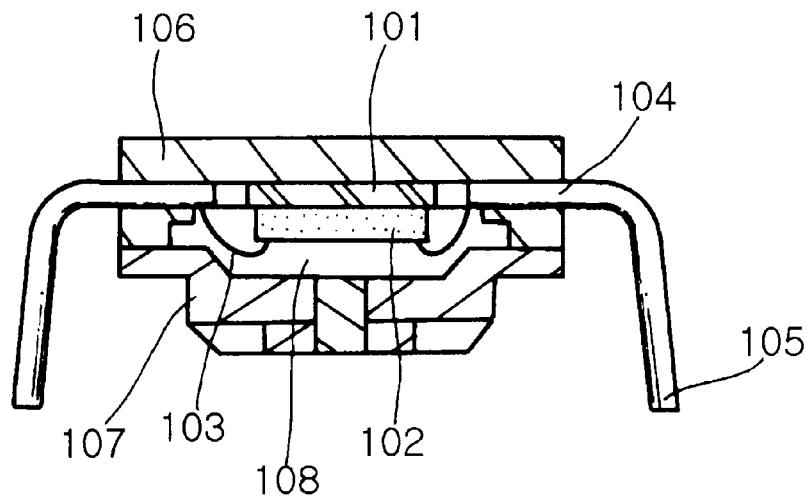
FIG. 1 is a sectional view of a conventional optical mouse package using lead frames.
Figure 2:
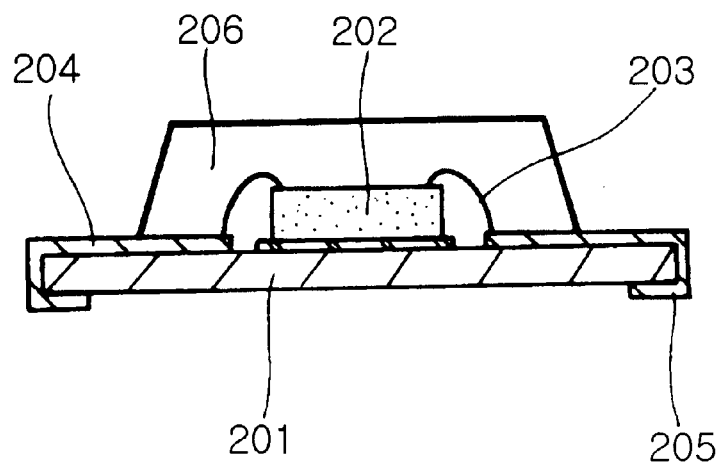
FIG. 2 is a sectional view of a typical semiconductor chip on board package.
Figure 3A:
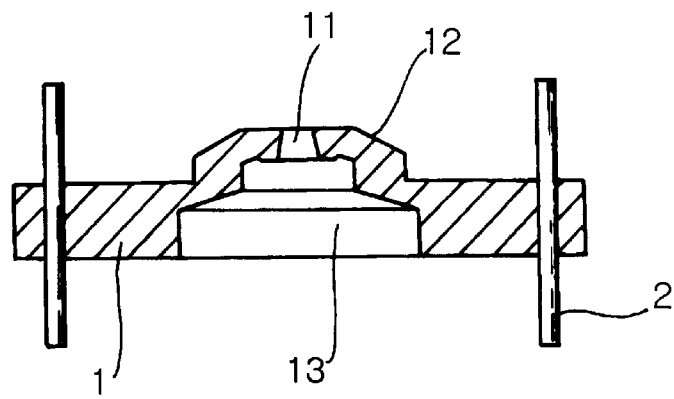
FIGS. 3A to 3C are views showing the construction and assembly sequence of parts of a chip on board package for optical mice according to a preferred embodiment of the present invention.
Figure 3B:
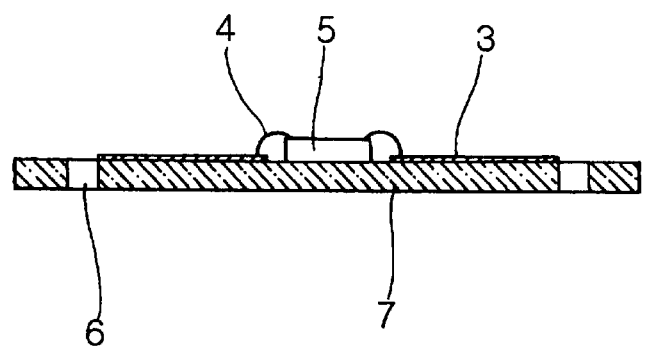
Figure 3C:
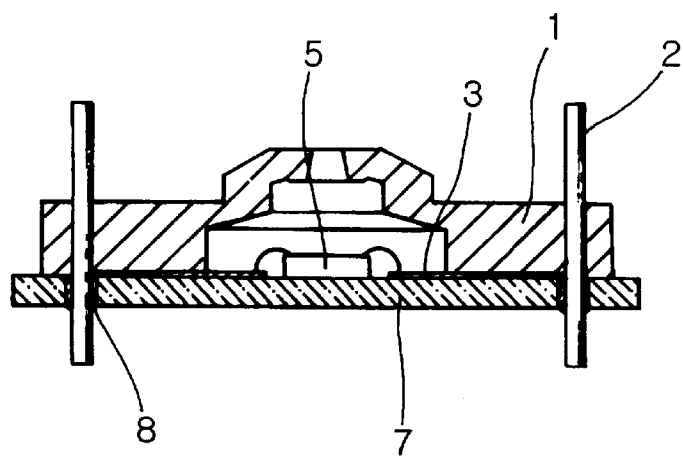

FIGS. 3A to 3C are views showing the construction and assembly sequence of parts of a chip on board package for optical mice according to a preferred embodiment of the present invention.

FIG. 3A shows a lens cover 1 according to a preferred embodiment of the present invention. Electrode pins 2 functioning as lead frames are formed to be integrated with the lens cover 1 such that the electrode pins 2 are positioned along opposite side surfaces of the lens cover 1. In this case, the pins 2 are protruded from the lens cover 1 upwardly and downwardly by a predetermined length. Further, a lens 11 for receiving light is disposed at a center portion of the lens cover 1. A protrusion 12 being more protruded than other portions of the lens cover 1 is formed at the portion to which the lens 11 is disposed. Further, an opening 13 to accommodate a semiconductor chip mounted on a board as described later is formed in a center portion within the lens cover 1.

FIG. 3B shows a board 7 combined with the lens cover 1. The board 7 has top and bottom surfaces, wherein a semiconductor chip 5 is mounted on the center portion of the top surface of the board 7. The semiconductor chip 5 has a plurality of electrode terminals formed therein. In the board 7, via holes 6 are formed to allow the electrode pins 2 of the lens cover 1 to be inserted into the holes 6. In the preferred embodiment, the via holes 6 are positioned along an arbitrary side surface of the board 7 and its opposite side surface, and formed to pass through the top and bottom surfaces of the board 7.

Further, on the top surface of the board 7, circuit patterns 3 are formed to be extended from the position of the semiconductor chip 5 to the via holes 6. The semiconductor chip 5 is electrically connected to the circuit patterns 3 by fine gold wires, that is, bonding wires 4. Therefore, the semiconductor chip 5 forms electrical connections with the circuit patterns 3 on the top surface of the board 7 as in a conventional COB package.

The board 7 and the lens cover 1 formed by the above process are combined with each other as shown in FIG. 3C. The lens cover 1 is formed to cover the top surface of the board 7. The lens 11 is disposed on the same axis as that of the semiconductor chip 5 thus enabling inputted light to reach the semiconductor chip 5 through the lens 11. Therefore, the electrode pins 2 and the via holes 6 must be adjusted in their formation positions such that the lens 11 and the semiconductor chip 5 are disposed on the same axis. The lens cover 1 encloses the top surface of the board 7 while being in contact with top surface of the board 7. The lens cover 1 and the board 7 are adhered to each other using an adhesive applied at their contact portions. Simultaneously, the electrode pins 2 pass through the via holes 6 to be protruded downwardly. In this case, the electrode pins 2 are bonded to the via holes 6 with solder 8, and are electrically connected to the circuit patterns 3 on the top surface of the board 7.

Therefore, the electrode pins 2 function as lead frames of the combined semiconductor chip package for optical mice. Further, the semiconductor chip 6 within the package is mounted on the board 7 according to a typical chip on board method.

In the above embodiment, the via holes 6 formed on the board 7 are disposed along opposite side surfaces of the board 7. The pins 2 and the lens cover 1 are integrated into one body through injection molding. The injection molding is compared with molding of a typical lead frame package. The lens cover 1 of the present invention uses straight pins, and the structure of the pins is simple, so the molding can be easily performed, and complicated molding is not required. Further, one end of each of the electrode pins 2 passes through each via hole 6 of the board 7 and protrudes downwardly from the bottom surface of the board 7, while the other end thereof is protruded upwardly from the top surface of the board 7 to be higher than the protrusion 12 formed on the center portion of the lens cover 1. Therefore, the arrangement of input/output (I/O) terminals of the semiconductor chip package and leads can be freely designed. Further, the chip on board package of this invention can be applied to various products.

Figure 4:
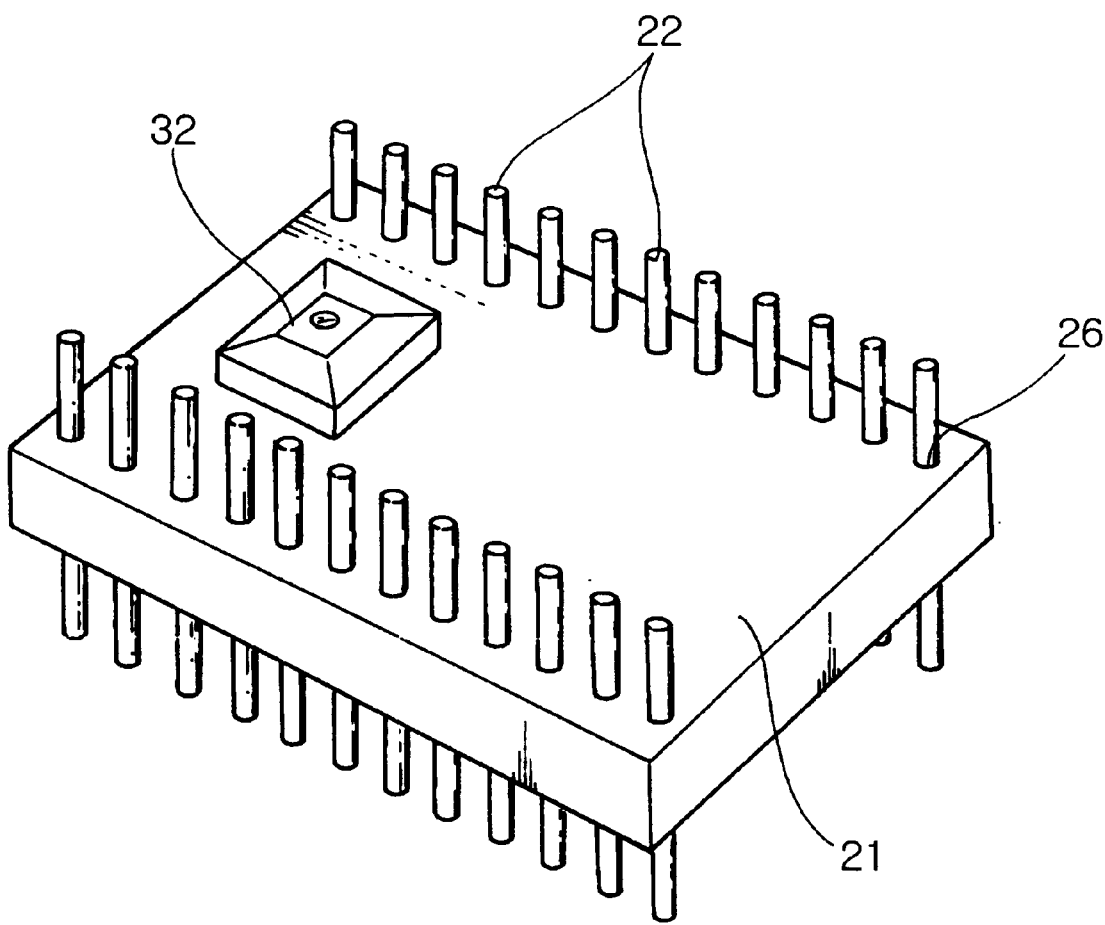
FIG. 4 is a perspective view of another chip on board package for optical mice according to another preferred embodiment of the present invention.
Figure 5A:
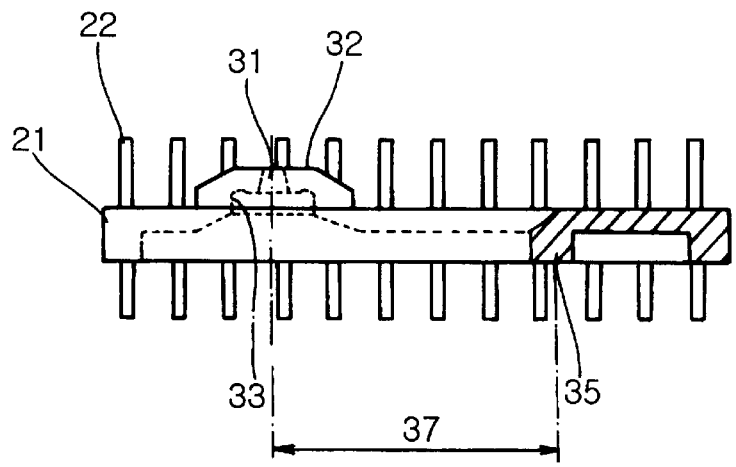
FIGS. 5A to 5C are views showing the construction and assembly sequence of parts of the chip on board package of FIG. 4.
Figure 5B:
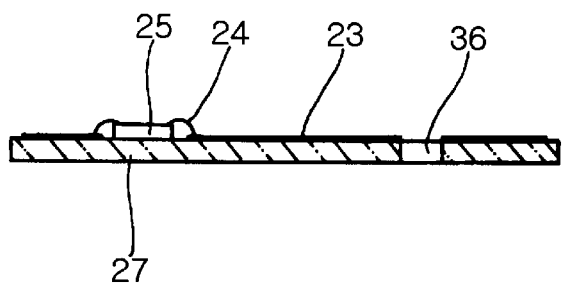
Figure 5C:
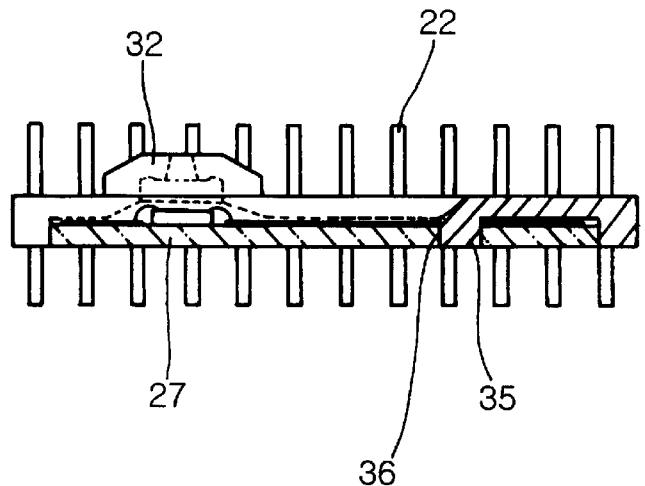

FIG. 4 is a perspective view of another semiconductor chip on board package for optical mice according to another preferred embodiment of the present invention. In this embodiment, a plurality of pins 22 are arranged along opposite longer side surfaces of a lens cover 21 in a longitudinal direction of the lens cover 21. FIGS. 5A to 5C are views showing the construction and assembly sequence of parts of the chip on board package of FIG. 4.

Referring to FIG. 4 and FIG. 5A, a protrusion 32 to which a lens 31 is attached is formed on the lens cover 21 as in the above embodiment of the present invention. However, the embodiment of FIG. 4 is different from the above embodiment of FIGS. 3A to 3C in that the protrusion 32 is formed in not the center portion of the cover 21, but a portion offset from the center. The lens cover 21 is formed to be integrated with a plurality of electrode pins 22. A plurality of electrode pins 22 are arranged along opposite side surfaces in a longitudinal direction of the lens cover 21 at regular intervals. The pins 22 are protruded from the cover 21 upwardly and downwardly by a predetermined height, and preferably protruded to be higher than the protrusion 32. Further, the pins 22 are protruded downwardly while passing through via holes of a board described later. An opening 33 to accommodate a semiconductor chip mounted on the board described later is formed in a center portion within the lens cover 21.

FIG. 5B shows a board 27 combined with the lens cover 21. The board 27 has top and bottom surfaces, wherein a semiconductor chip 25 is mounted at a portion offset from a center on the top surface of the board 27. The semiconductor chip 25 has a plurality of electrode terminals formed therein. In the board 27, a plurality of via holes 26, into which the electrode pins 22 of the lens cover 21 are inserted, are formed. In this preferred embodiment, the via holes 26 are oppositely arranged in the longitudinal direction of the board 27, positioned along opposite longitudinal side surfaces, and formed to pass through the top and bottom surfaces of the board 27. Preferably, in order to protect the semiconductor chips 5 and 25 respectively mounted on the boards 7 and 27 of FIG. 3B and FIG. 5B and wires 4 and 24 connected thereto, a wall (not shown) with a predetermined height is formed around a position, on which each semiconductor chip is mounted, with resin. Then, the wall is filled with transparent resin, thus enabling each semiconductor chip and wires to be protected by the transparent resin. Therefore, the wall serves to contain the transparent resin so as to allow the transparent resin to cover only the semiconductor chip and wires.

Further, circuit patterns 23 are formed on the top surface of the board 27 to be extended from the position of the semiconductor chip 25 to the via holes 26. The semiconductor chip 25 is electrically connected to the circuit patterns 23 by fine gold wires, that is, bonding wires 24.

The board 27 and the lens cover 21 formed by the above process are combined with each other as shown in FIG. 5C. The lens cover 21 encloses the top surface and each side surface of the board 27. The lens 31 is disposed on the same axis as that of the semiconductor chip 25, thus enabling inputted light to reach the semiconductor chip 25 through the lens 31. As described above, in order to adjust both the lens 31 and the semiconductor chip 25 such that both are positioned on the same axis, a fixing hole 36 and a fixing protrusion 37 are formed in the board 27 and the lens cover 21, respectively. The fixing protrusion 35 is formed to be protruded from the cover 21 downwardly, while being spaced apart from the center of the protrusion 32 in the lens cover 21 by a predetermined spaced distance 37. In this case, the fixing protrusion 35 is cylindrically formed. Further, the fixing hole 36 corresponding to the fixing protrusion 35 of the lens cover 21 is formed in the board 27 so as to allow the fixing protrusion 35 to be inserted into the fixing hole 36. Therefore, a centering process between the lens and the semiconductor chip is simplified by inserting the fixing protrusion 35 into the fixing hole 36, thereby simplifying an entire manufacturing process of the semiconductor chip on board package.

The lens cover 21 encloses the board 27 while being in contact with the top surface and each side surface of the board 27. The lens cover 21 and the board 27 are adhered to each other using an adhesive applied at their contact portions. Simultaneously, the electrode pins 22 pass through the via holes 26 to be protruded downwardly. In this case, the electrode pins 22 are bonded to the via holes 26 with solder, and are electrically connected to the circuit patterns 23 on the top surface of the board 27, the same as the embodiment of FIGS. 3A to 3C.

In the preferred embodiment, the holes 26 formed on the board 27 are oppositely arranged in a longitudinal direction of the board 27, formed along opposite longer .side surfaces of the board 27 and arranged at regular intervals. The pins 22 and the lens cover 21 are integrated into one body through injection molding. In this case, the number of pins 22 arranged in the cover 21 is the same as that of the via holes 26. In the construction of this embodiment of the present invention, it is possible to produce a package having more than 24 pins, compared with a conventional package typically having 13 pins. Therefore, the chip on board package of the present invention is advantageous in that it can easily increase the number of terminals due to enlargement of functions of a mouse.

Figure 6:
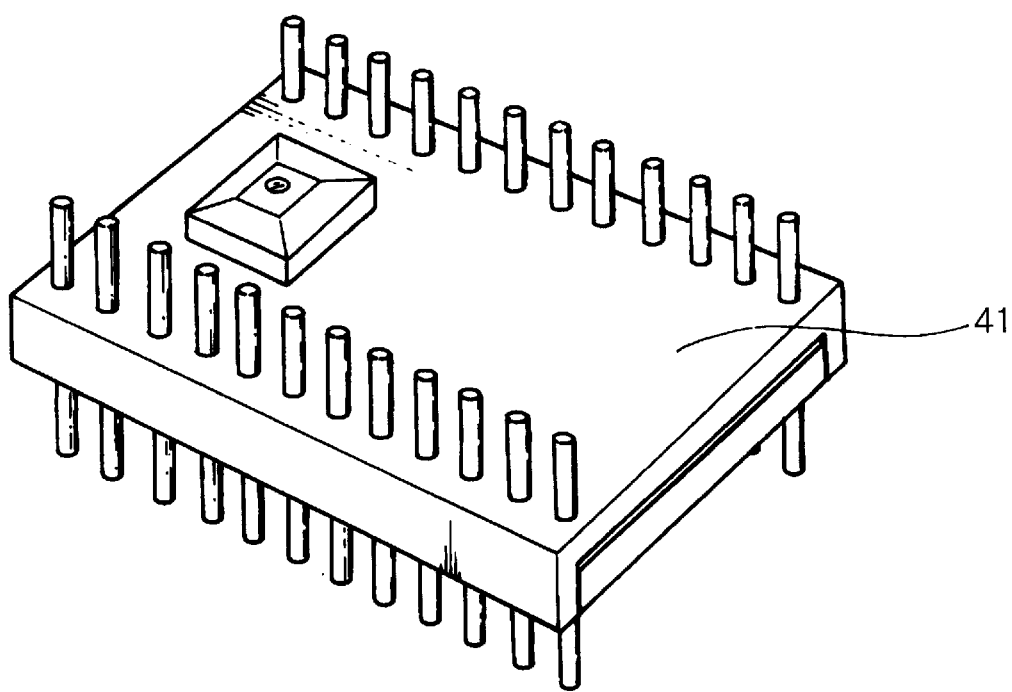
FIG. 6 is a perspective view of a further chip on board package for optical mice according to a further preferred embodiment of the present invention.

FIG. 6 shows a modified embodiment of the lens cover of FIG. 5A. As shown in FIG. 6, two shorter sides of all sides of a lens cover 41 are opened. Therefore. the lens cover 41 is combined with a board 27, while being in contact with only the top surface and two longer side surfaces of the board 27. Accordingly, even if there is an error in the size of the board 27, or there is variation in length of the board 27 in a manufacturing process, a phenomenon that the lens cover 41 is not perfectly fitted to the board 27 can be prevented. Further, it is possible to carry out a process for obtaining a package by producing several boards at a time, combining the several not-cut boards with lens covers, and then cutting the boards individually. This process is advantageous in that it can simplify and facilitate a manufacturing process of a chip on board package, compared with a conventional process for first cutting respective boards, and combining respective boards with respective lens covers, thus improving productivity of a semiconductor chip on board package.

As described above, the present invention provides a semiconductor chip on board package for optical mice and lens cover for the same, which can simplify and facilitate a manufacturing process of a chip on board package, can reduce initial investment cost thereof, can reduce a development time thereof, and can cope with variations in products, by using a lens cover integrated with electrode pins, and without using a construction in which a semiconductor chip is directly connected to lead frames.

Further, the present invention can provide a semiconductor chip on board package for optical mice and lens cover for the same, which can be used as a lead frame package when the chip on board package is mounted on a set, and can have more terminals than those of a conventional semiconductor chip package.

Moreover, the present invention is advantageous in that central axes of both a lens and a semiconductor chip can easily correspond to each other when a board and a lens cover are assembled, and the lens cover has opened sides so as to combine several not-cut boards with lens covers, thus improving productivity of a semiconductor chip on board package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor chip on board package for optical mice,comprising:
   a board having top and bottom surfaces, and a pair of via holes formed along opposite side surfaces of the board to pass through the top and bottom surfaces;
   a semiconductor chip attached to a center portion on the top surface of the board and provided with a plurality of electrode terminals formed therein;
   at least one circuit pattern formed on the top surface of the board to be extended from the position to which the semiconductor chip of the board is attached, to positions in which the via holes are formed;
   at least one bonding wire for electrically connecting the electrode terminals of the semiconductor chip with the circuit pattern; and
   a lens cover for enclosing the top surface of the board, the lens cover having a lens disposed on the same axis as that of the semiconductor chip, a pair of electrode pins formed at positions of the lens cover corresponding to the positions of the pair of via holes in the board to be integrated with the lens cover, and an opening formed in a center portion within the lens cover for accommodating the semiconductor chip therein,
   wherein one end of each of the electrode pins of the lens cover is protruded downwardly from the bottom surface of the board through each via hole when the lens cover is combined with the board, and the electrode pins are bonded to the via holes of the board with solder, thus enabling the electrode pins to be electrically connected to the circuit pattern of the board.

2. The semiconductor chip on board package for optical mice according to claim 1, wherein the electrode pins and the lens cover are integrated into one body by injection molding.

3. The semiconductor chip on board package for optical mice according to claim 1, wherein the lens cover is designed such that its center portion is formed to be protruded relative to other portions of the lens cover, thus allowing the lens and the semiconductor chip to be spaced apart from each other.

4. The semiconductor chip on board package for optical mice according to claim 3, wherein the electrode pins are formed such that the other end of each electrode pin is protruded to be higher than the protruded center portion of the lens cover.

5. A semiconductor chip on board package for optical mice, comprising:
   a board having top and bottom surfaces, and a plurality of via holes formed along opposite longer side surfaces of the board to pass through the top and bottom surfaces;
   a semiconductor chip arranged between the opposite via holes on the top surface of the board and provided with a plurality of electrode terminals formed therein;
   at least one circuit pattern formed on the top surface of the board to be extended from the position to which the semiconductor chip of the board is attached, to positions in which the via holes are formed;
   at least one bonding wire for electrically connecting the electrode terminals of the semiconductor chip with the circuit pattern; and
   a lens cover for enclosing the top surface of the board, the lens cover having a lens disposed on the same axis as that of the semiconductor chip, a plurality of electrode pins formed at positions of the lens cover corresponding to the positions of the via holes in the board to be integrated with the lens cover, and an opening formed in a center portion within the lens cover so as to prevent interference with the semiconductor chip,
   wherein one end of each of the electrode pins of the lens cover is protruded downwardly from the bottom surface of the board through each via hole when the lens cover is combined with the board, and the electrode pins are bonded to the via holes of the board with solder, thus enabling the electrode pins to be electrically connected to the circuit pattern of the board.

6. The semiconductor chip on board package for optical mice according to claim 5, wherein the electrode pins and the lens cover are integrated into one body by injection molding.

7. The semiconductor chip on board package for optical mice according to claim 5, wherein the lens cover has a fixing protrusion disposed between opposite electrode pins and formed to be protruded downwardly from the bottom surface of the lens cover, and the board has a fixing hole formed on its top surface such that the fixing protrusion can be inserted thereinto.

8. The semiconductor chip on board package for optical mice according to claim 5, wherein the lens cover is designed such that a portion at which the lens is disposed is formed to be protruded relative to other portions of the lens cover, thus allowing the lens and the semiconductor chip to be spaced apart from each other.

9. The semiconductor chip on board package for optical mice according to claim 8, wherein the electrode pins are formed such that a first end of each electrode pin is protruded to be higher than the protruded center portion of the lens cover.

10. The semiconductor chip on board package for optical mice according to claim 5, wherein the lens cover is designed such that its opposite shorter sides are opened so as to prevent the opposite shorter sides of the lens cover from coming in contact with opposite shorter side surfaces of the board.

11. A lens cover used for a chip on board package for optical mice, the lens cover enclosing a board, in which a semiconductor chip having a plurality of electrode terminals formed therein is attached to a top surface of the board, a plurality of via holes are formed along opposite longer side surfaces of the board to pass through the top and bottom surfaces, at least one circuit pattern is formed on the top surface of the board to be extended from the position to which the semiconductor chip is attached, to positions in which the via holes are formed, and the electrode terminals of the semiconductor chip are electrically connected to the circuit pattern by wire bonding, wherein:

the lens cover encloses the top surface of the board and has a lens disposed on the same axis as that of the semiconductor chip, a plurality of electrode pins formed at positions of the lens cover corresponding to the positions of the via holes in the board to be integrated with the lens cover, and an opening formed in a center portion within the lens cover so as to prevent interference with the semiconductor chip, and one end of each of the electrode pins of the lens cover is protruded downwardly from the bottom surface of the board through each via hole when the lens cover is combined with the board, and the electrode pins are bonded to the via holes of the board with solder, thus enabling the electrode pins to be electrically connected to the circuit pattern of the board.

12. The lens cover according to claim 11, wherein the lens cover has a fixing protrusion disposed between opposite electrode pins and formed to be protruded downwardly from the bottom surface of the lens cover, and the board has a fixing hole formed on its top surface such that the fixing protrusion is inserted into the fixing hole.

13. The lens cover according to claim 11, wherein the lens cover is designed such that a portion at which the lens is disposed is formed to be protruded relative to other portions of the lens cover, thus allowing the lens and the semiconductor chip to be spaced apart from each other.

14. The lens cover according to claim 13, wherein the electrode pins are formed such that a first end of each electrode pin is protruded to be higher than the protruded center portion of the lens cover.

15. The lens cover according to claim 11, wherein the lens cover is designed such that its opposite shorter sides are opened so as to prevent the opposite shorter sides of the lens cover from coming in contact with opposite shorter side surfaces of the board.

16. The lens cover according to claim 11, wherein the electrode pins and the lens cover are integrated into one body by injection molding.

* * * * *